United States Patent
Kaminski et al.

[11] Patent Number: 5,953,815
[45] Date of Patent: Sep. 21, 1999

[54] METHOD FOR MAKING AN ELECTRICAL CONNECTION

[75] Inventors: Michael G. Kaminski, San Jose; Michael R. Butler, Livermore, both of Calif.; Stuart A. White; Diane M. White, both of Middleboro, Mass.

[73] Assignee: Volex Inc., Sunnyvale, Calif.

[21] Appl. No.: 08/932,195

[22] Filed: Sep. 17, 1997

Related U.S. Application Data

[62] Division of application No. 08/577,298, Dec. 22, 1995, abandoned.

[51] Int. Cl.$^6$ .............................. H01R 4/02; H01R 43/02
[52] U.S. Cl. .............................. 29/860; 439/701; 439/874
[58] Field of Search .................................. 439/399, 407, 439/492, 494, 497, 499, 874, 733.1, 942, 948, 701; 29/860, 879, 857

[56] References Cited

U.S. PATENT DOCUMENTS

| | | | |
|---|---|---|---|
| 3,088,086 | 4/1963 | Crimmins | 339/17 |
| 3,601,768 | 8/1971 | Lightner | 339/103 |
| 3,867,005 | 2/1975 | Hoppe, Jr. | 339/98 |
| 3,905,665 | 9/1975 | Lynch et al. | 339/17 |
| 4,097,106 | 6/1978 | Over et al. | 339/99 |
| 4,599,588 | 7/1986 | Bell | 335/127 |
| 4,605,276 | 8/1986 | Hasircoglu | 339/176 |
| 4,657,322 | 4/1987 | Grellmann et al. | 339/17 |
| 4,709,973 | 12/1987 | Waters et al. | 439/78 |
| 4,734,054 | 3/1988 | Steffinger | 439/399 |
| 4,767,342 | 8/1988 | Sato | 439/78 |
| 4,920,642 | 5/1990 | Yanai et al. | 29/860 |
| 4,973,264 | 11/1990 | Kamono et al. | 439/498 |
| 4,993,968 | 2/1991 | Guletsky et al. | 439/492 |
| 5,112,233 | 5/1992 | Lybrand | 439/79 |
| 5,231,758 | 8/1993 | Schauer | 29/856 |
| 5,385,490 | 1/1995 | Demeter et al. | 439/579 |
| 5,514,006 | 5/1996 | Getselis et al. | 439/417 |

OTHER PUBLICATIONS

Catalog from Molex Incorporated, "LFH Matrix 50 & 75 Connector Systems", 1994, 28 pages.

*Primary Examiner*—Neil Abrams
*Attorney, Agent, or Firm*—Testa, Hurwitz & Thibeault, LLP

[57] ABSTRACT

A device and method for making an electrical connection (40) has a body (42) constructed from an electrically-insulating material and the body (42) defines a plurality of channels (44). Each of at least some of the channels (44) forms a media bore (46) and a connector bore (50). The body (42) also forms a connection void (41) which intersects at least two of the channels (44) to form connection cavities (48) in those channels (44). Energy-transmitting media, such as wires (52), may be inserted into the media bores (50) such that each of the media extends into a different one of the connection cavities (48). Energy-transmitting means, such as pins (56), may be inserted into the connector bores (50) so that each of the energy-transmitting means extends into a different one of the connection cavities (48). Solder (54) is placed in all the connection cavities (48) in order to connect electrically the energy-transmitting media and the energy transmitting means in each of the connection cavities (48) simultaneously. The solder may then be processed, e.g. reflowed, to isolate the various electrical connections thus formed. In some embodiments of the body (42) a pin stop (60) is disposed above each of the media bores (46) in order to limit the depth to which energy-transmitting means may be inserted into the connector bores (50). In further embodiments, the energy transmitting means is the pins of a contact stick such as a Low Force Helix ("LFH") contact stick. The device (40) may be formed with a stacking cavity (58) located to receive a bus bar (70) on a like device (40') when the devices are stacked.

10 Claims, 6 Drawing Sheets

SECTION B-B

FIG. 4C

SECTION C-C

METHOD FOR MAKING AN ELECTRICAL CONNECTION

This is a divisional of application Ser. No. 08/577,298 filed on Dec. 22, 1995 and now abandoned.

FIELD OF THE INVENTION

This invention relates to electrical connections and, more particularly, to methods and related apparatus for making electrical connections.

BACKGROUND OF THE INVENTION

Electrical connections in many applications are commonly made by soldering, crimping, or clamping separate conductors together. These methods were adequate when the separate conductors were wires of various gauges, however, the tendency towards miniaturization and increased complexity of electrical systems have made traditional methods for making electrical connections problematic.

Connectors increasingly require higher connector pin densities (i.e., more pins and less connector area). For example, a line of Low Force Helix ("LFH") connectors made by Molex Incorporated of Lisle, Ill. includes connectors ranging from 60 pins to 240 pins. Molex's "LFH" 50 I/O Shielded connector requires four stacked rows of fifteen pins to fit within a rectangular area of less than one inch wide by less than a third of an inch high. Similarly, Molex's "LFH" Matrix 75 Board-to-Board Unshielded 240 Circuit Vertical connector requires ten stacked rows of twenty-four pins to fit within a rectangular area of two inches wide by less than seven-tenths of an inch high. For all of the connectors in the above-mentioned line of products, as well as connectors generally, each connector pin must be connected to a corresponding wire element in a cable. The close physical proximity of connector pins to one another tends to make soldering unreliable, as solder overflow and wire misalignment can cause short circuits between connector pins. Crimping or clamping mechanisms for connector cables like the ones previously mentioned can be time-consuming, especially if each individual wire element must be crimped or clamped individually. Further, crimping or clamping the wires can cause physical trauma which weakens the wires and can ultimately lead to open circuits.

A known way of dealing with these problems involves using a dielectric body with metal contacts fitted within the body. While this type of body allows an electrical connection to be made between the connector pins and the cable wires, the addition of the metal contacts inside the dielectric body is undesirable for a number of reasons, including that it generally increases the cost per unit significantly.

The present invention is a device, and related method, which facilitates making an electrical connection, reliably and inexpensively, while avoiding the drawbacks of known devices and methods.

SUMMARY OF THE INVENTION

The present invention relates to a device, and use thereof, for making an electrical connection accurately, reliably, quickly, and inexpensively. The device of the present invention is made of an electrically-insulating material, and it defines a plurality of channels. The channels automatically align disparate electrical conductors and eliminate misalignment of conductors. Each of at least some of these channels forms a media bore, means for transmitting electrical energy, and a connection cavity. Energy-transmitting media (e.g., pre-tinned electrical wires) are inserted into the media bores such that each energy-transmitting media extends into a different one of the connection cavities. Solder is placed into the connection cavities in order to connect electrically the energy-transmitting media and the energy transmitting means. All of the energy-transmitting media inserted into the device are thus connected at the same time to the energy transmitting means.

In some preferred embodiments, the energy transmitting means comprises a connector bore for receiving the pins of, for example, a Low Force Helix ("LFH") contact stick. "LFH" is a term which is descriptive of the shape of the male contacts at the end of the "LFH" contact stick that does not plug into the device of the invention (i.e., the end of the "LFH" contact stick which is opposite the pins of the "LFH" contact stick which do plug into the device). In some other embodiments, the energy transmitting means comprises a plurality of connector pins (e.g., the pins of a "LFH" stick) that are already part of, or connected to, the device. The channels can include locking means which serve to retain the energy transmitting means and the energy-transmitting media within the channels by friction. Also, the device can be provided with a bus bar for electrically connecting selected ones of the pins. The device also can be provided with a stacking cavity which allows multiple devices to be stacked compactly while also accommodating any bus bars that may be present.

The foregoing and other objects, aspects, features, and advantages of the invention will become more apparent from the following description and from the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figure 1:
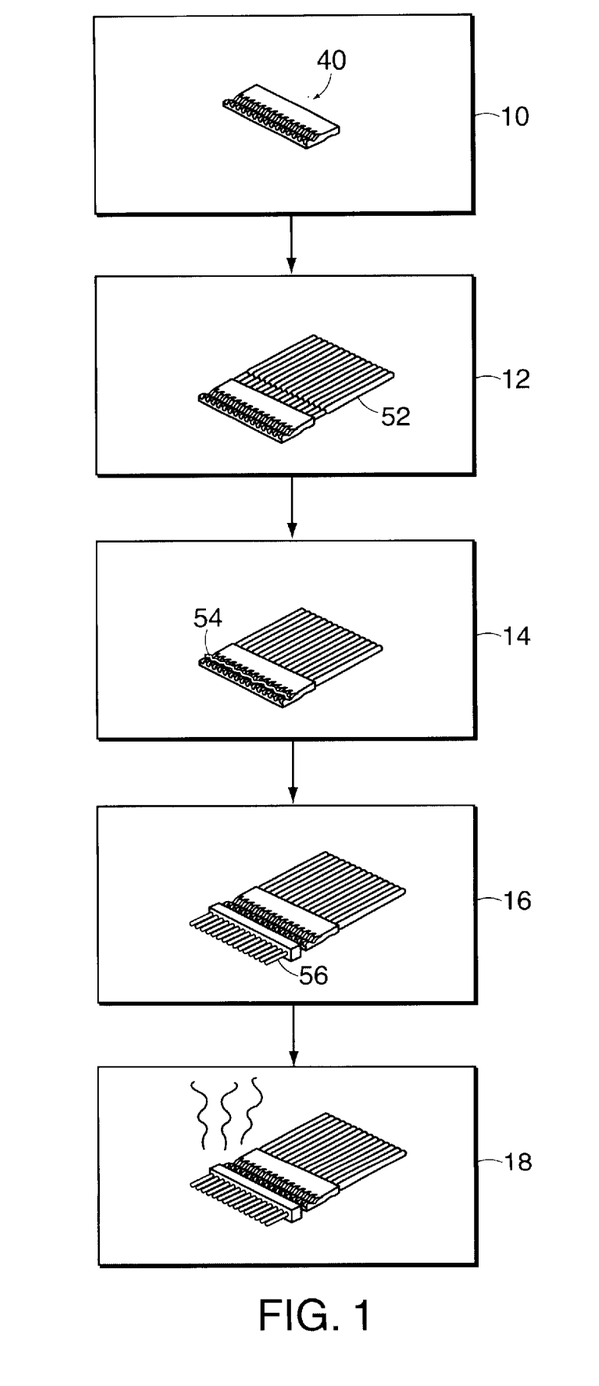
FIG. 1 is a diagrammatic flowchart illustrating the steps to be performed in making an electrical connection, according to one aspect of the invention.
Figure 3:
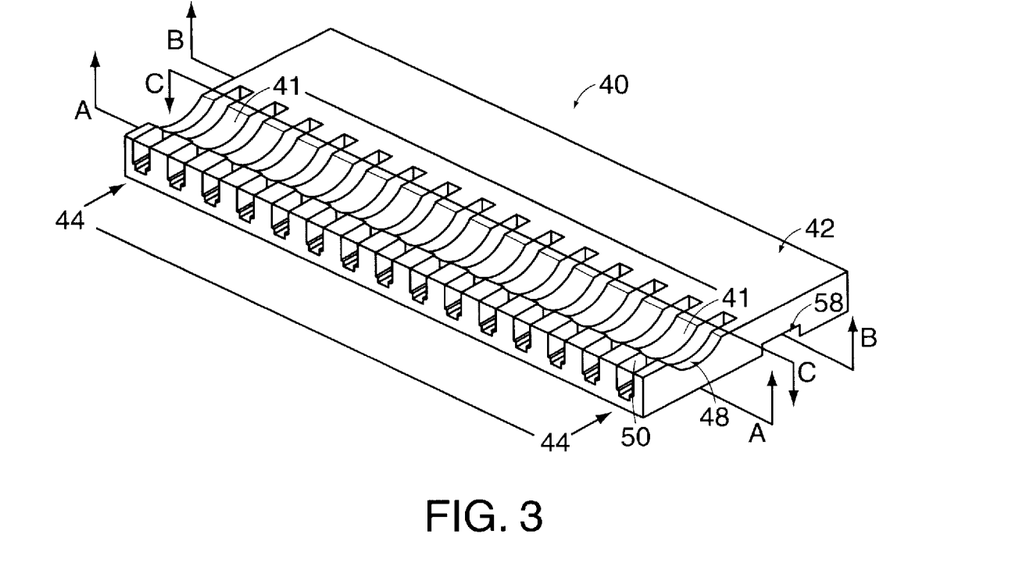
FIG. 3 is a perspective view of a device according to the invention.

Referring to FIG. 1 and FIG. 3, a device 40 for use in making an electrical connection is made of an electrically insulating material, and it defines a number of channels 44.

Each of at least some of these channels 44 comprises a media bore 46, a connection cavity 48, and means for transmitting energy. In the preferred embodiment, each channel 44 comprises the media bore 46, the connection cavity 48, and the energy-transmitting means. In the preferred embodiment, the energy-transmitting means is a plurality of connector bores 50 for receiving the pins 56 of, for example, a Molex "LFH" contact stick. In an alternative embodiment, the energy-transmitting means includes the pins 56 already inserted into, or already a part of, the device 40.

Still referring to FIG. 1, a single one of the devices 40 is provided (step 10) and used, as described below. It is possible, and within the scope of the invention, to facilitate mass production by providing and acting on two or more of the devices 40 at the same time. Pre-tinned wires 52 are inserted into the media bores 46 such that each of the wires 52 extends into a different one of the connection cavities 48 defined by the device 40 (step 12). Although the term "wires" is generally used herein, any energy-transmitting media can be inserted into the media bores 46 including, but not limited to, copper wire, copper alloy wire, metal alloy wire, coaxial cable, or even fiber optic cable if the appropriate coupling hardware is utilized. Thus, the term "wire" or "wires" should generally be taken to mean any energy-transmitting media and not just pre-tinned wires. The number of wires 52 inserted into the media bores 46 generally is equal to the number of media bores 46, although there may be fewer wires 52 than media bores 46. The wires 52 may be inserted at the same time, or they may be inserted separately. The plurality of wires 52 can be inserted into the device 40 to almost any depth, provided that each of the wires 52 extends at least into the connection cavities 48 defined by the device 40.

Solder 54 is then placed into the connection cavities 48 such that the solder 54 physically contacts the plurality of wires 52 (step 14). As used herein, "solder" is meant to cover any substance or conducting medium which can form an electrical connection between the wires 52 and the pins 56 inserted into the energy-transmitting means. Thus, for the pretinned wires 52, traditional tin solder may be used, while a different substance may be necessary for fiber optic cable or coaxial cable. The solder 54 can start out in solid (e.g., a roll of solder wire) or paste (e.g., a tube of solder paste) form. In general, any solder substance is suitable if it is capable of conducting electricity from the wires 52 to the pins 56. In applying the solder 54, it may be applied as one mass across all connection cavities 48 (i.e., a connection void 41) or as a bead of solder 54 dotted into each of the individual connection cavities 48. However it is applied, enough solder 54 must be provided to result in an adequate electrical connection between the wires 52 and the pins 56. While not necessary to practice the present invention, solder 54 can also provide a degree of physical bonding between the wires 52 and the pins 56.

Figure 2:
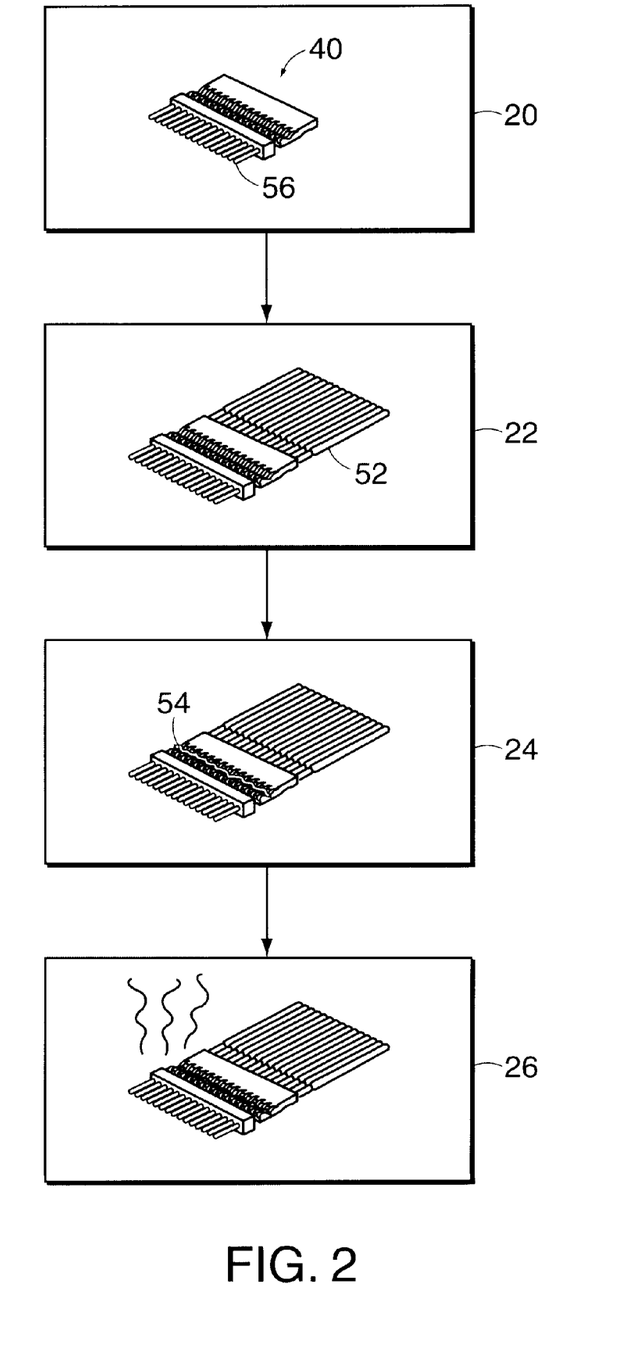
FIG. 2 is a diagrammatic flowchart illustrating the steps to be performed in making an electrical connection, according to another aspect of the invention.

The pins 56 are now inserted into the device 40 (step 16) such that each of the pins 56 extends into a different one of the connection cavities 48 and contacts the solder 54. As used herein, "pin" or "pins" is meant generally to refer to the connector pins that get inserted into (or are already inserted into or are part of, as shown in FIG. 2) the device 40, and also it is meant generally to cover the entire contact stick, which includes the connector pins 56 that get inserted into the device 40 and the other end of the contact stick which can have male or female contacts. With a "LFH" contact stick, the contacts opposite the pins are male contacts having a slightly helical shape. In the preferred embodiment, the pins 56 are inserted into device 40 far enough to contact physically the wires 52. While the pins 56 do not have to contact the wires 52 physically, the pins 56 generally must physically contact the solder 54 in the connection cavities 48. All of the pins 56 can be provided at the same time as part of a premanufactured "contact stick" (as is preferred), or alternatively the pins 56 can be individual pins which must be individually inserted into the device 40. In the preferred embodiment, the pins 56 are provided as part of a "LFH" contact stick, as commercially available from at least Molex Incorporated of Lisle, Ill.

At this point, any additional processing required in order for the solder 54 to form a reliable electrical connection is done (step 18). For example, if, as in the preferred embodiment, the solder 54 is tin solder, it is heated until it "reflows" (i.e., until it liquefies and pools in the channels 44) thereby forming an electrical connection between the wires 52 and the pins 56. While the primary purpose of the solder 54 is to connect electrically the wires 52 and the pins 56, the solder 54 will also provide a degree of physical bonding between the wires 52 and the pins 56. The additional processing (step 18) should be controlled so that it does not affect the device 40 or the wires 52. For example, if heat must be applied to "reflow" the solder 54, the temperature should be high enough to melt the solder 54 without damaging the device 40, the wires 52, or the pins 56.

Each of the channels 44 of the device 40 preferably has a locking means for retaining the pre-tinned wires 52 and connector pins 56. The locking means are formed by the channel 44. In general, any locking means that can be formed by the channel 44 can be used such as a locking detent, a crimp bore, or a pressure clamp, so long as the locking means is formed by the channel 44 itself. In the preferred embodiment, friction is used as the locking means. That is, the walls of each of the channels 44 are sized such that, when the wires 52 are inserted into the channels 44, the walls of each channel 44 are slightly forced apart. The pressure of the channel walls against adjacent channels 44 retains the wires 52 in adjacent channels 44 by friction.

Referring now to FIG. 2, in an alternative embodiment according to the invention, the device 40 includes the pins 56 already connected thereto or already part thereof (step 20). Thus, in this alternative embodiment, the energy-transmitting means is the plurality of pins 56 themselves and not the connector bores 50 for receiving the pins 56. As stated previously, the pins 56 can be manufactured into the device 40, e.g., by molding the device 40 around the pins 56. Alternately, the pins 56 may be secured in the channels 44 prior to the beginning of assembly according to the invention.

As before, the wires 52 are inserted into the media bores 46 (step 22). The solder 54 is then placed into the connection cavities 48 (step 24), and heat is applied to reflow the solder (step 26). The locking means preferably are as described previously.

In general, the device 40 (and thus a body 42 of the device 40) can be made from any electrically insulating material. While material choice may vary for different applications, it is noted that thermoplastics having a high heat deflection temperature such as polycyclohexylene terephtalate and liquid crystal polymer are generally preferred. Currently most preferred for making the device 40 is polyphenyl sulfide.

Referring to FIGS. 3 and 4A–4D, the body 42 of the device 40 defines the plurality of channels 44 and a stacking cavity 58. The device 40 includes the stacking cavity 58 in the preferred embodiment, but the device 40 can be used without the stacking cavity 58. The channels 44 defined by the body 42 are all electrically insulated from each other by the body 42 itself. In the preferred embodiment, each of the channels 44 defines one of the connector bores 50, one of the connection cavities 48, and one of the media bores 46. In the alternative embodiment, each of the channels 44 defines one of the connection cavities 48 and one of the media bores 46, and the connector pins 56 are already present.

Figure 4A:
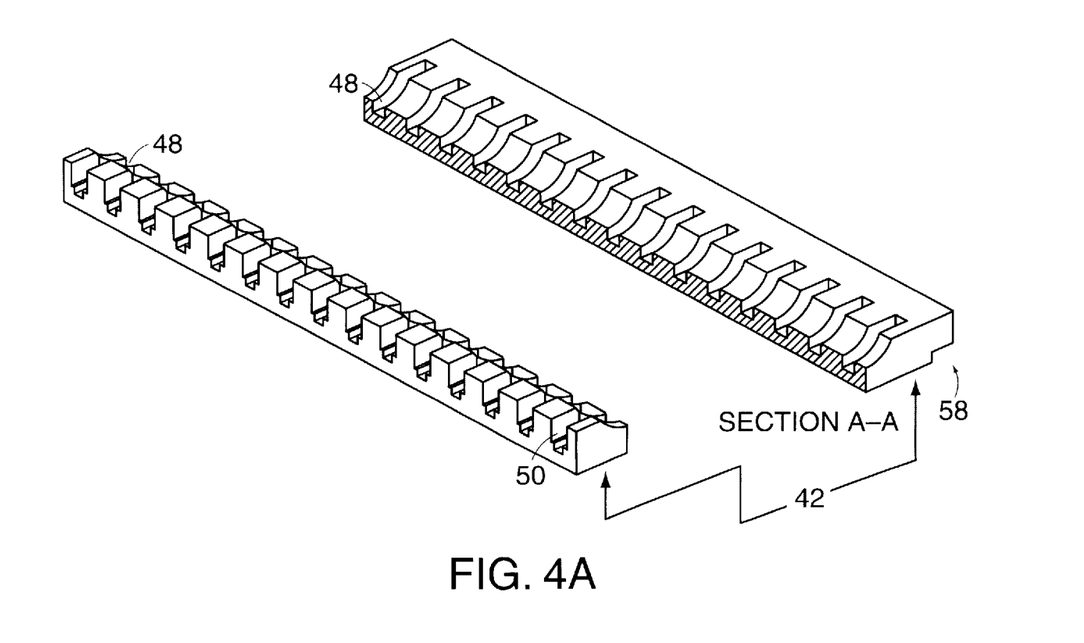
FIGS. 4A, 4B, and 4C are views in cross-section of portions of the device of FIG. 3 taken along lines A—A, B—B, and C—C, respectively.
Figure 4B:
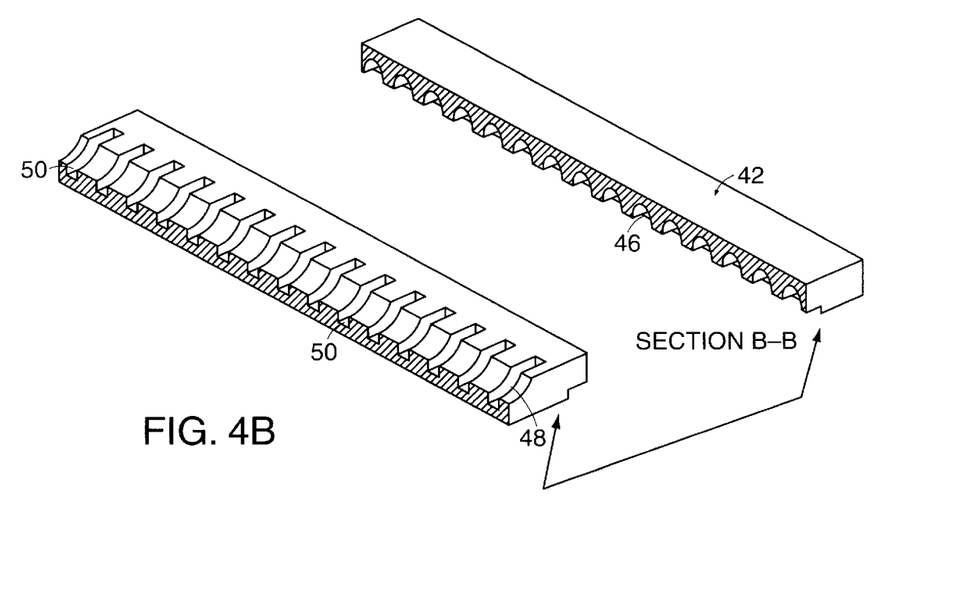
Figure 4C:
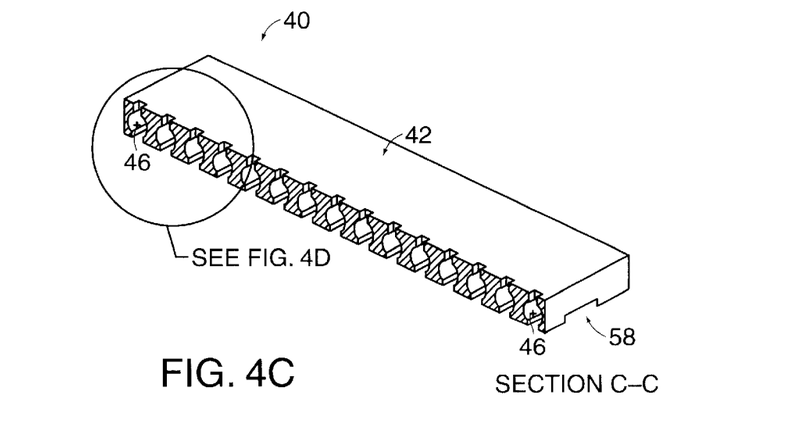
Figure 4D:
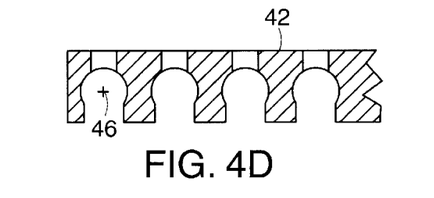
FIG. 4D is a close up view of a media bore.

The channels 44 can be any size or shape, provided that the media bores are slightly smaller than the wires 52 they accommodate. Similarly, it is preferred that the connector bores 50 are slightly smaller than the pins 56 they accommodate. FIG. 4D shows a close-up view of the currently preferred media bore 46. When a wire 52 is inserted into media bore 46, the wire 52 causes the body 42 on either side of the wire 52 to compress, as the media bore must enlarge slightly to accommodate the wire 52. This pressure inside the body 42 causes the inserted wires 52 to be retained by friction.

Figure 5A:
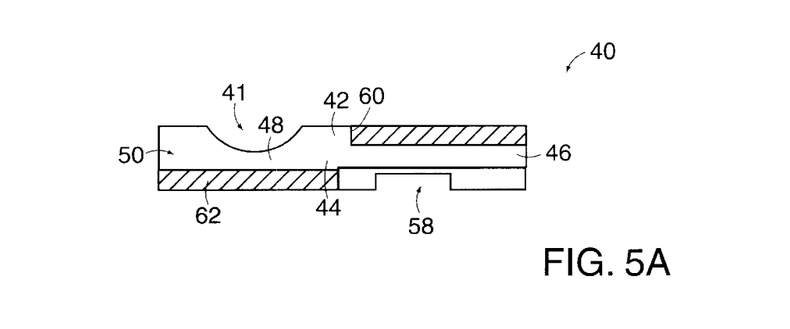
FIG. 5A is a cross-section of the device of FIG. 3 along a channel before it is used to manufacture a connector.

FIG. 5A shows the device 40 of the present invention as it appears before it is used to manufacture a connector. Just above media bore 46 is a pin stop 60, which is used to limit the depth the pins may be inserted into the body 42 of the device 40. Similarly, just below the connector bore 50 is a wire stop 62. Wire stop 62 contacts the insulation of wire 52 in order to limit the depth to which wire 52 may be inserted into the body 42 of the device 40.

Figure 5B:
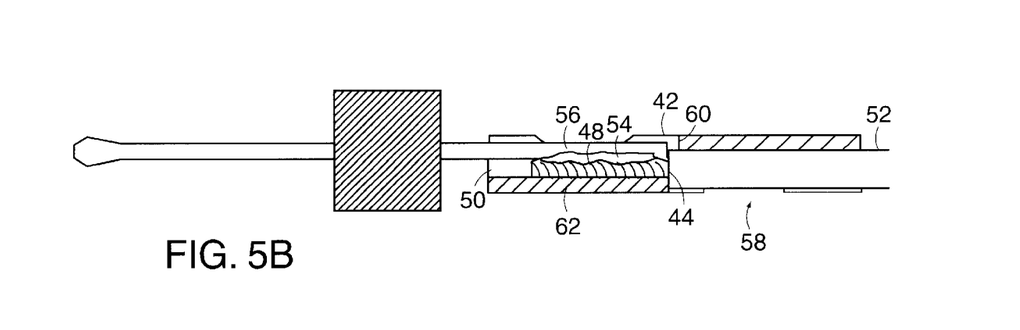
FIG. 5B is a cross-section of the device of FIG. 3 along a channel after it is used to manufacture a connector.

FIG. 5B shows the device 40 after it is used to manufacture a connector. Wires 52 are shown fully inserted, that is, the insulation of wires 52 physically contacts the wire stop 62, but it is necessary only that the wires be inserted far enough to contact the solder 54. Pins 56 are shown inserted into the body 42 of the device 40, but they are not fully inserted, i.e. they are not shown contacting the pin stop 60. Wires 52 need only contact the solder 54 that is disposed in the connection cavity 48.

The body 42 preferably is one monolithic piece of material, although it is possible that two or more pieces could be assembled to form the body 42 of the device 40. The connection cavities 48 generally can be formed in a variety of sizes or shapes as long as the channels 44 are exposed part of the way along their length to allow the solder to be received. The connection cavities 48 should be large enough to receive the solder but small enough such that the body 42 remains sufficiently rigid to provide a degree of structural support for the manufactured connector. For example, the body 42 of the device 40 should be sufficiently rigid so that the wires 52 and the pins 56 are held together once they are inserted into the body 42, reducing the possibility of an open circuit occurring.

Figure 6A:
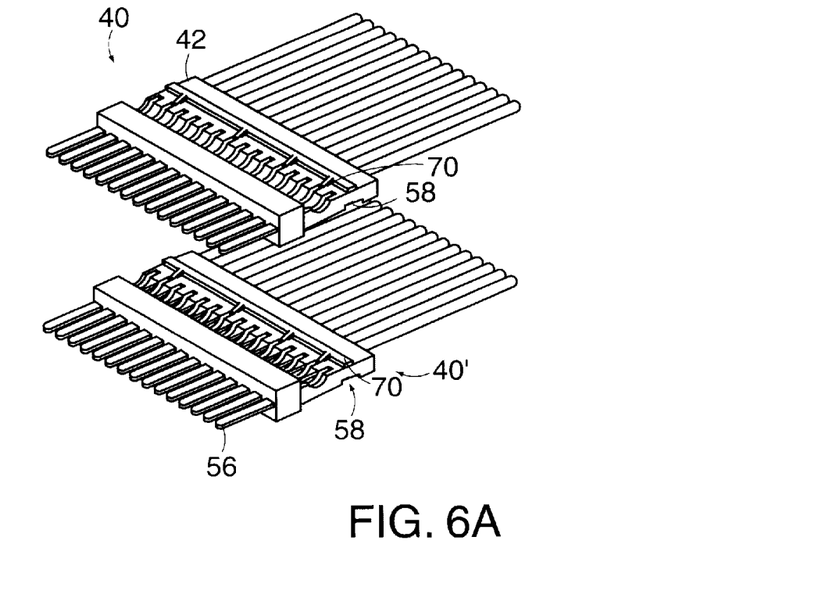
FIG. 6A is a perspective view of two devices which can be stacked according to the invention.
Figure 6B:
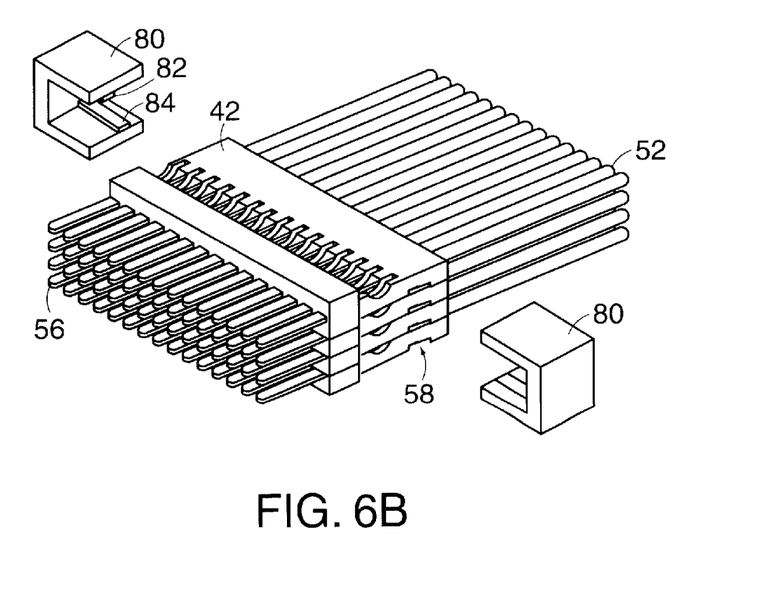
FIG. 6B is a perspective view of four stacked devices wherein a bus bar of a "just below" device is accommodated by a stacking cavity of a "just above" device and showing wire management clips.

Referring to FIGS. 6A and 6B, a bus bar 70 can be provided to electrically connect selected ones of the pins 56, whether the pins 56 are inserted during assembly (as in the preferred embodiment) or pre-connected to/pre-manufactured with the device 40 (as in the alternative embodiment). The bus bar 70 typically is made of metal but it generally can be made of any electrically conducting material. The bus bar 70 can have a variety of shapes and sizes as long as it is useful for making an electrical connection between selected ones of the pins 56. The bus bar 70 typically is inserted into the channel 44 in the area of the connection cavity 48, and is soldered into place.

The stacking cavity 58 is of sufficient size and shape to accommodate a bus bar 70. The stacking cavity of a first device 40 is designed to accommodate a bus bar of a second device 40' when that second device 40' is stacked directly under the first device 40. The stacking cavity thus allows devices 40 to be stacked on top of the other devices 40 in a tight, compact fashion even if one or more of those devices has a bus bar 70.

Wire management clips 80 can be provided when a number of devices 40 are stacked. The wire management clips 80 secure the devices 40 to each other and prevent them from sliding in a sideways fashion. An upper boss 82 and a lower boss 84 are provided on the inside of the wire management clips 80. Upper boss 82 is adapted to fit inside of the connector cavity 48 of the top-most device 40 in the stack. Lower boss 84 is adapted to fit in the stacking cavity 58 of the bottom device 40 in the stack. When the upper boss 82 and the lower boss 84 are engaged, devices 40 are prevented from sliding forward or backward.

While a preferred embodiment of the invention has been described using specific terms, such description is for illustrative purposes only, and variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A method for making an electrical connection, comprising:
    (A) providing a device comprising a body of electrically-insulating material, the body defining a plurality of channels and a connection void, each of at least some of the channels comprising a media bore for receiving energy-transmitting media, and a connector bore for receiving means for transmitting electrical energy, the connection void intersecting at least two of the channels defined by the body to form a connection cavity in each of the channels;
    (B) inserting a plurality of the energy-transmitting media into the media bores such that each of the plurality of media extends into a different one of the connection cavities; and
    (C) placing solder as a single mass into the connection void such that the solder separately electrically connects each of the plurality of energy-transmitting media with one of the energy transmitting means.

2. The method of claim 1 wherein step (A) comprises providing a device in which the energy transmitting means received in the connector bores comprise a plurality of pins, at least some of the plurality of pins extending into the connection cavities.

3. The method of claim 1 further comprising the step of:
    (D) providing a plurality of connector pins as the energy transmitting means and inserting the pins into the connector bores such that each of the plurality of connector pins extends into a different one of the connection cavities and the solder separately electrically connects the media and the connector pins.

4. The method of claim 3 wherein step (D) comprises providing a plurality of low force helix contact stick connector pins as the plurality of connector pins.

5. The method of claim 1 wherein step (B) comprises inserting the plurality of energy-transmitting media into the media bores such that each of the plurality of media physically contacts one of the energy transmitting means.

6. The method of claim 1 wherein step (C) further comprises heating the single mass of solder until the solder flows into each of the connection cavities.

7. The method of claim 1 wherein said step (A) comprises providing a device that further comprises locking means.

8. The method of claim 7 further comprising (D) engaging the locking means to retain the plurality of energy-transmitting media in the media bores.

9. The method of claim 7 further comprising the steps of:
   (D) providing a plurality of connector pins as the energy transmitting means and inserting the pins into the connector bores such that each of the plurality of connector pins extends into a different one of the connection cavities and the solder separately electrically connects the media and the pins, and
   (E) engaging the locking means to retain the plurality of connector pins in the connector bores.

10. A method for making an electrical connection, comprising:
   (A) providing a first device comprising a body comprising electrically-insulating material, the body defining a stacking cavity, a connection void, and a plurality of channels, each of at least some of the channels comprising a media bore for receiving energy-transmitting media, and a connector bore for receiving means for transmitting electrical energy, the connection void intersecting at least two of the channels to form a connection cavity in each of the channels;
   (B) inserting a plurality of the energy-transmitting media into the media bores such that each of the plurality of media extends into a different one of the connection cavities;
   (C) placing solder as a single mass into the connection void such that the solder separately electrically connects each of the plurality of energy-transmitting media with one of the energy transmitting means;
   (D) repeating steps (A)–(C) for a second device; and
   (E) stacking the first device and the second device.

* * * * *